(12) United States Patent
Lange et al.

(10) Patent No.: US 10,170,899 B2
(45) Date of Patent: Jan. 1, 2019

(54) METHOD FOR CONNECTING AT LEAST TWO ELECTRIC CABLES AND CONNECTION DEVICE, KIT, ELECTRIC MACHINE AND ASSOCIATED VEHICLE

(75) Inventors: Thomas Lange, Fürth (DE); Ekkehard Pittius, Roth (DE); Valerias Schmidt, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 827 days.

(21) Appl. No.: 13/996,421

(22) PCT Filed: Dec. 8, 2011

(86) PCT No.: PCT/EP2011/072219
§ 371 (c)(1),
(2), (4) Date: Jun. 20, 2013

(87) PCT Pub. No.: WO2012/084534
PCT Pub. Date: Jun. 28, 2012

(65) Prior Publication Data
US 2013/0293046 A1 Nov. 7, 2013

(30) Foreign Application Priority Data
Dec. 21, 2010 (DE) .......................... 10 2010 063 776

(51) Int. Cl.
*H02G 1/14* (2006.01)
*H02G 3/16* (2006.01)
(Continued)

(52) U.S. Cl.
CPC ................. *H02G 3/16* (2013.01); *H02G 1/14* (2013.01); *H02G 3/00* (2013.01); *H05K 7/02* (2013.01);
(Continued)

(58) Field of Classification Search
CPC ........ H01R 9/226; H01R 9/24; H01R 9/2458; H01R 9/2675; H01R 9/2491; H01R 4/00;
(Continued)

(56) References Cited

U.S. PATENT DOCUMENTS 502,083 A * 7/1893 McEvoy .......................... 174/59
2,360,304 A 10/1944 McLoughlin et al.
(Continued)

FOREIGN PATENT DOCUMENTS

CH 346 594 A 5/1960
CH 380 206 A 7/1964
(Continued)

OTHER PUBLICATIONS

Chinese Search Report dated Aug. 5, 2015 with respect to counterpart Chinese patent application 2011800608651.
(Continued)

*Primary Examiner* — Dimary Lopez Cruz
(74) *Attorney, Agent, or Firm* — Henry M. Feiereisen LLC

(57) ABSTRACT

A connection device for connecting at least two electric cables to an electric machine in a vehicle includes a housing and at least two contact elements. At least two openings, each allowing the passage of one of the cables, are located in the housing wall in such a way that only one of the cables that are fed in a direction through the openings in the housing and that continue to run in a straight line in the direction inside the housing makes direct contact with precisely one of the contact elements and can be electrically connected to this contact. All the other cables can be connected to a respective element of the remaining contact elements using a respective conductor bar.

22 Claims, 3 Drawing Sheets

(51) Int. Cl.
*H02G 3/00* (2006.01)
*H05K 7/02* (2006.01)

(52) U.S. Cl.
CPC .... *Y10T 29/49208* (2015.01); *Y10T 29/53143* (2015.01)

(58) Field of Classification Search
CPC ......... H01R 11/00; H01R 11/01; H01R 11/03; H01R 11/05; H01K 5/225; Y10T 29/5313
USPC ......... 361/679.01, 823, 641; 174/50, 59, 60, 174/68.2, 72 B, 71 B, 88 B, 70 B, 99 B, 174/129 B, 133 B, 541; 439/721, 224, 439/709, 798, 799; 29/874, 876, 592.1; 310/71, 89
See application file for complete search history.

(56) References Cited

U.S. PATENT DOCUMENTS

| | | | | |
|---|---|---|---|---|
| 3,444,310 | A * | 5/1969 | Stewart | H01R 24/76 174/59 |
| 3,848,224 | A * | 11/1974 | Olivero | 439/721 |
| 4,210,772 | A * | 7/1980 | Magana | H02G 3/083 174/59 |
| 5,212,346 | A * | 5/1993 | Clark | H01R 4/4818 174/59 |
| 5,698,820 | A * | 12/1997 | Collard | H02G 3/10 174/57 |
| 5,936,200 | A * | 8/1999 | Park | H01R 4/26 174/59 |
| 6,392,148 | B1 * | 5/2002 | Ueno | B60R 16/0215 174/117 F |
| 6,693,370 | B2 * | 2/2004 | Yamane | B60R 16/0238 174/68.2 |
| 6,736,715 | B2 * | 5/2004 | Kuhn | H02G 3/083 29/868 |
| 7,279,633 | B2 * | 10/2007 | Waters | H02G 3/08 174/50 |
| 7,342,173 | B1 | 3/2008 | Kidman | |
| 7,614,922 | B1 * | 11/2009 | Buse | H01R 4/4818 439/439 |
| 7,615,715 | B2 | 11/2009 | Hofmann et al. | |
| 8,446,058 | B2 * | 5/2013 | Avula et al. | 310/71 |
| 2002/0123275 | A1 | 9/2002 | Zhao | |
| 2010/0218797 | A1 * | 9/2010 | Coyle et al. | 136/243 |
| 2010/0294529 | A1 * | 11/2010 | Nunokawa | 174/60 |

FOREIGN PATENT DOCUMENTS

| | | |
|---|---|---|
| CN | 1095866 A | 11/1994 |
| CN | 201238170 Y | 5/2009 |
| DE | 16 08 173 U | 6/1950 |
| DE | 10 36 972 B | 8/1958 |
| DE | 11 12 157 B | 8/1961 |
| DE | 19 12 962 U | 4/1965 |
| DE | 12 76 161 B | 8/1968 |
| DE | 60221409 T2 | 4/2008 |
| EP | 0 961 376 A1 | 12/1999 |
| FR | 2 067 893 A5 | 8/1971 |
| FR | 2 628 577 A1 | 9/1989 |
| GB | 145 356 A | 7/1920 |
| RU | 2293414 C1 | 2/2007 |
| RU | 2325743 C2 | 5/2008 |
| RU | 2354021 C1 | 4/2009 |

OTHER PUBLICATIONS

Translation of Chinese Search Report dated Aug. 5, 2015 with respect to counterpart Chinese patent application 2011800608651.

\* cited by examiner

METHOD FOR CONNECTING AT LEAST TWO ELECTRIC CABLES AND CONNECTION DEVICE, KIT, ELECTRIC MACHINE AND ASSOCIATED VEHICLE

CROSS-REFERENCES TO RELATED APPLICATIONS

This application is the U.S. National Stage of International Application No. PCT/EP2011/072219, filed Dec. 8, 2011, which designated the United States and has been published as International Publication No. WO 2012/084534 and which claims the priority of German Patent Application, Serial No. 10 2010 063 776.9, filed Dec. 21, 2010, pursuant to 35 U.S.C. 119(a)-(d).

BACKGROUND OF THE INVENTION

The invention relates to a connecting device for connecting at least two electric cables to an electric machine of a vehicle, with a housing and at least two contact elements, wherein at least two first openings for the passage of a cable in each case are arranged in a housing wall so that all cables routed in a first direction through the first openings into the housing and continuing onwards in a straight line in the first direction within the housing meet one of the contact elements in each case. The invention also relates to a kit with such a connecting device, an electric machine with such a connecting device, a vehicle with such a connecting device and also a method for connecting at least two electric cables.

Power connections are generally provided for heavy current devices in terminal boxes specifically embodied for this purpose. The form and design of the terminal box frequently has to take account of restricted space requirements. Restricted space requirements are especially prevalent in drive motors in the bogey area of rail vehicles and also in the wheel hub of waste tippers. It is usual in this case to always construct individual customer solutions, which make it possible for the cables to only ever exit from a welded or cast terminal box in one direction. Similar applications, although they mostly allow the use of identical motors, suitably modify the terminal boxes belonging to the motors in accordance with the customer's requirements. A design with additional terminal boxes is also possible.

SUMMARY OF THE INVENTION

The object of the invention is to provide a connection option for cables in which different cable routings are made possible without extensive structural variations having to be required for the connection. Better account is also to be taken of restricted space requirements.

According to one aspect of the invention, the object is achieved by a connection device for connecting at least two electric cables to an electric machine of a vehicle, with a housing and at least two contact elements, wherein at least two first openings for the passage of one of the cables in each case are arranged in a housing wall so that all cables routed in a first direction through the first openings into the housing and running onwards in the first direction in a straight line within the housing meet each precisely one contact element, wherein at least two second openings for the passage of one of the cables in each case are arranged in the housing wall so that, of the cables routed in a second direction through the second openings into the housing and running onwards in the second direction in a straight line within the housing, exclusively one directly meets precisely one of the contact elements and is able to be connected electrically to said element and all remaining cables are able to be electrically connected to one of the remaining contact elements by means of a conductor bar in each case, wherein the second direction is essentially at right angles to the first direction.

According to another aspect of the invention, the object is achieved by a kit including a connecting device as set forth above, at least one conductor bar, which is able to be connected electrically on one side to one of the at least two contact elements of the connecting device and on the other side to one of the cables, and at least one support element, which is embodied for support of the at least one conductor bar.

According to yet another aspect of the invention, the object is achieved by an electric motor, especially an electric motor for driving a vehicle, including a connecting device as set forth above.

According to yet another aspect of the invention, the object is achieved by a vehicle especially a commercial vehicle, with an electrical machine as described above, which is especially embodied as a wheel hub motor.

The inventive connection device serves to connect at least two electric cables to an electric machine of a vehicle. It comprises a housing and at least two contact elements, wherein at least two first openings for the passage of a cable in each case are arranged in a housing wall of the housing so that all cables routed in a first direction through the first openings into the housing and continuing onwards in a straight line in the first direction within the housing meet one of the contact elements in each case. The housing can especially comprise a number of housing walls, which together surround an interior of the housing. The housing walls can especially be essentially at right angles to one another. However variations from a cuboid housing shape are also conceivable, so that the housing walls are arranged in relation to one another in the form of a trapeze. The walls can also be arranged tilted in relation to one another here. The housing can especially also be embodied in a number of pieces. The cables can especially be routed into the housing at right angles to a housing wall through the respective openings in this housing wall. Within the housing the cables run especially entirely in a straight line, meaning there are no bends or angles in the course of a cable, in order to meet its associated contact element. As an alternative the cables can continue essentially in a straight line within the housing but can have slight bends and angles, which however do not have any influence on the basic tendency of the direction in which they run. In particular the course of the cable can deviate from a perfect straight line within the framework of normal tolerances.

In accordance with the invention there are at least two second openings arranged in the housing wall for the passage of a cable in each case such that, of the cables routed in the second direction via the second openings into the housing and running onwards in the second direction within the housing, exclusively one directly meets precisely one of the contact elements. This cable is then able to be connected electrically to the associated contact element. All remaining cables are each able to be connected electrically to one of the other contact elements by means of a conductor bar in each case. In particular the other contact elements do not directly meet the contact element associated with them in each case. The second direction runs essentially at right angles to the first direction. The first and second openings can then especially lie in planes at right angles to one another.

In this way cables can be routed in one and the same connection device in two different directions essentially lying at right angles to one another. An electrical connection of all cables is possible without problems for both routing variants. A very variable connection facility for the cables is thus provided. If, instead of a first connection option with a first cable routing direction, the requirement is to realize a second connection option with a cable routing direction essentially at right angles to said direction, a new connection device does not have to be provided, but instead the inventive connection device can be used. In this way a standardized and universally-applicable connection device is created and a customer solution able to be realized at low cost is provided. Cable routing can be calculated and is transparent, so that connection errors are avoided and a high degree of installation security is guaranteed. The connection device is also extremely space-saving.

Preferably the connection device includes a receiving element, which is assigned to one of the contact elements. The receiving element predetermines a spatial arrangement for a support element, which is embodied to support one of the conductor bars. The support element is able to be attached to the receiving element. The connection device is thus prepared in the optimum way for the at least two connection options. To connect the contact elements via the conductor bars to the cables routed in the second direction, suitable support elements merely have to be introduced into the receiving elements provided for this purpose and attached there, in order to guarantee very good support for the respective conductor bars. In particular the conductor bars can also be attachable to the support element. The receiving element can especially be a cutout reserved for the support element. The receiving elements predetermine intuitively detectable required positions for the support elements, so that an incorrect connection of the cables to the contact elements can be reliably prevented.

Preferably at least two contact elements are disposed along a straight line which runs in the second direction. A simple and easily verifiable, essentially right-angle geometrical arrangement is produced, which facilitates connection of the cables and contributes to the standardization of the connection device.

Preferably the at least two contact elements are embedded into a base element. They are able to be electrically contacted exclusively from one side of the contact element, which lies in the plane spanned by the first and second direction. In particular the contact elements can be embedded into the base element such that they are not able to be electrically contacted from any of the sides which are essentially at right angles to the first and/or second direction. The single electrically contactable side of each contact element thus has a normal which is at right angles to the direction vectors belonging to the first and second direction. This connection type is secure and expedient. Undesired short circuits can be reliably avoided. The cables can be easily and simply attached to the contact elements.

Preferably at least one isolating bar is embodied on the base element, which runs between two adjacent elements of the at least two contact elements, so that a simultaneous electrical contacting of the two adjacent contact elements by a cable running in a straight line in the second direction is prevented. In this way an undesired short circuit between two adjacent contact elements can be securely avoided. Misconnection of the cables running in the second direction is prevented. The probability of short circuits by metal splinters, moisture, dirt etc. is reduced.

Preferably at least two third openings for the passage of one of the cables in each case are arranged in the housing wall so that, of the cables routed in a third direction through the third openings into the housing and continuing onwards in the third direction in a straight line within the housing, exclusively one directly meets precisely one of the contact elements and is able to be connected to said element and all other cables are able to be electrically connected to one of the contact elements in each case by means of a conductor bar, wherein the third direction is essentially antiparallel to the second direction. "Essentially antiparallel" is to be understood here as the second and third direction lying relative to one another so that the connection options can be realized without problems through the second and third openings as part of the usual tolerances. The third openings thus allow a connection option of the cables equivalent to the second openings. A very large number of connection options are created. At the same time the connection of the cables is embodied in an extremely uncomplicated and customer-friendly manner for all cable connection options.

Preferably at least two fourth openings for the passage of one of the cables in each case are disposed in the housing wall, so that all cables routed in a fourth direction through the fourth openings into the housing and continuing onwards within the housing in the fourth direction meet precisely one contact element in each case, wherein the fourth direction is essentially antiparallel to the first direction. "Essentially antiparallel" is to be understood here as the first and the fourth direction lying relative to each other such that the connection options via the first and fourth openings are able to be realized without problems as part of the usual tolerances. In particular the cables can each directly meet one of the contact elements and be able to be electrically connected with said element. Thus a fourth connection option and an improved opportunity for using the connection device are created. The cables can be connected from very many different directions.

An inventive kit comprises a connection device with a receiving element as well as at least one conductor bar which is able to be electrically connected on one side to one of the at least two contact elements and on the other side to one of the cables. Finally the kit also contains at least one support element which is embodied to support the at least one conductor bar. The kit thus comprises very few elements, with which a very variable connection of the cables is still made possible. If a transition is required from the connection of the cables for routing in the first direction to the connection of the cables for routing in the second direction, just the few conductor bars have to be electrically connected to the contact elements and supported by the support elements during this process. Suitable receiving elements are already available for the support elements in the connection device which predetermine its spatial arrangement. If there is a transition from one connection option to another connection option only the conductor bars and support elements have to be spatially differently arranged without significant constructional changes to the connection device being required.

Preferably the at least one support element is embodied from an electrically-isolating material. Undesired electrical contact between a conductor bar or a cable and a receiving element is then safely avoided.

An inventive electric machine includes an inventive connection device. The electric machine can especially involve an electric motor which serves to drive a vehicle. The electric motor is then especially a traction motor. As an alternative a generator can also be provided as an electric machine.

An inventive vehicle includes an electric machine according to the invention. The electric machine can preferably be embodied as an electric motor and then especially as a wheel hub motor. The vehicle can especially involve a commercial vehicle, preferably a waste tipper or a mining truck.

According to yet another aspect of the invention, the object is achieved by method which serves to connect at least two electric cables to an inventive connection device. It comprises the following steps:
a) Selection of one of the at least two second openings so that a cable routed in the second direction through the selected opening into the housing and continuing onwards in the second direction in a straight line within the housing directly meets precisely one of the contact elements;
b) Passing a first of the at least two cables in the second direction through the opening selected in step a) and onwards routing in a straight line in the second direction of this cable within the housing, until it meets one of the contact elements;
c) Direct electrical connection of the cable routed in step b) with the contact element met in step b);
d) Selection of at least one of the two second openings which does not correspond to the opening selected in step a);
e) Passing a second of the at least two cables in the second direction through the opening selected in step d) and onwards routing of this cable in a straight line in the second direction within the housing; and
f) Electrical connection of the cable routed in step e) with one of the contact elements, which does not correspond to the contact element met in step b), via a conductor bar.

The preferred embodiments and their advantages presented in relation to the inventive connection device apply equally for the inventive kit, the inventive electric machine, the inventive vehicle and also the inventive method.

Further features of the invention emerge from the claims, the figures and the figure description. The features and combination of features cited here in the figure description and also the features and feature combinations cited in the figure description and/or the features and feature combinations shown on their own in the figures are able to be used not only in the respective specified combination but also in other combinations or on their own, without departing from the framework of the invention.

BRIEF DESCRIPTION OF THE DRAWING

The invention is explained below in greater detail with reference to the exemplary embodiments, in which.

DETAILED DESCRIPTION OF PREFERRED EMBODIMENTS

Figure 1:
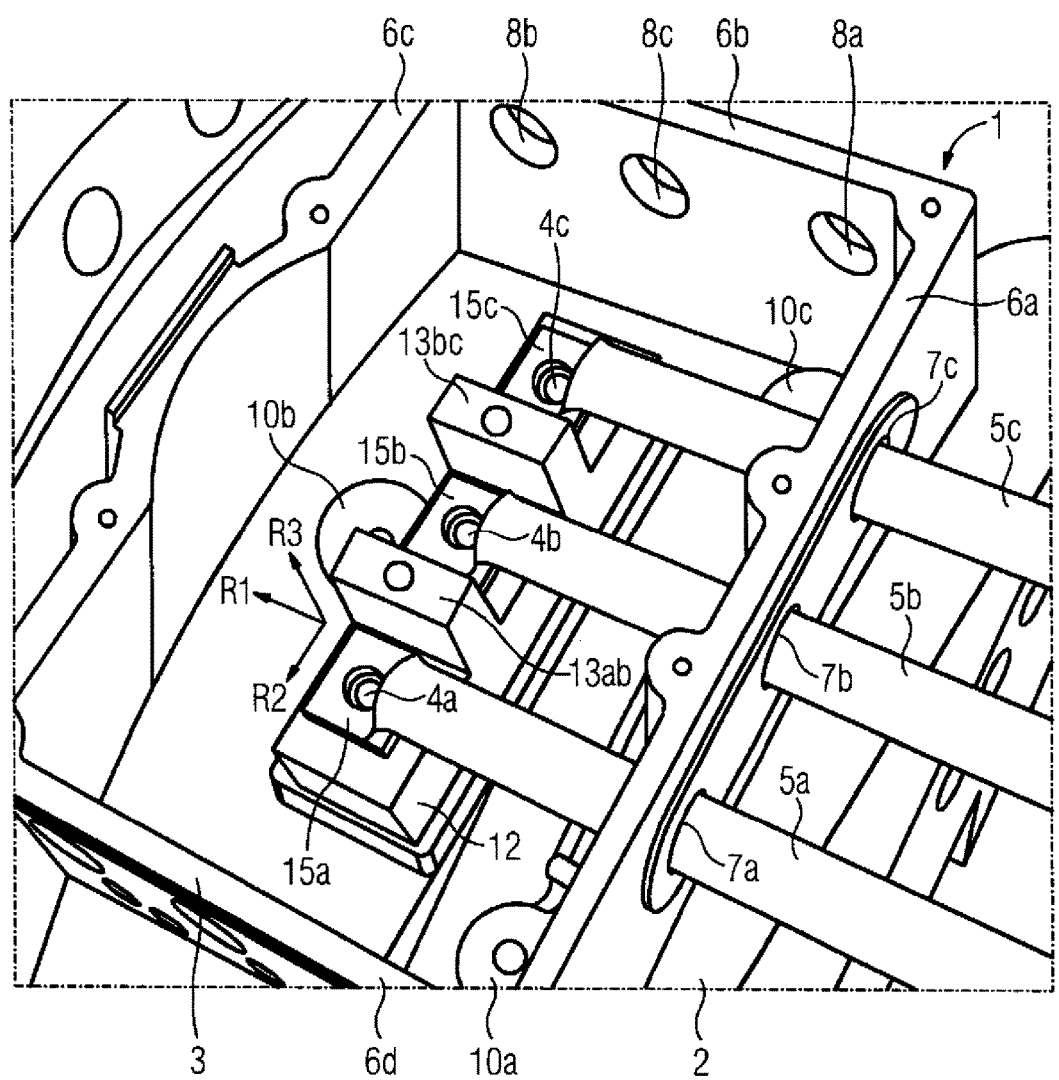
FIG. 1 shows a terminal box into which cables are routed in a first direction.

Elements which are the same or function in the same way are labeled with the same reference characters in the figures.
FIG. 1 shows a connection device which is embodied as a terminal box 1. The terminal box 1 is disposed on an electric motor 2. The electric motor 2 involved is a drive motor for mining trucks which is enclosed by a molded housing. The terminal box 1 is embodied as part of this molded housing. The terminal box 1 comprises a housing 3 with four housing wall sides 6a, 6b, 6c and 6d at right angles to one another.

Embodied in housing wall side 6a are three first openings 7a, 7b and 7c, which make access possible to the interior of the terminal box 1. A cable 5a is routed at right angles through the first opening 7a through the housing wall side 6a into the interior of the housing 3. Within the housing 3 the cable 5a runs onwards in the same direction in which it was routed through the first opening 7a; namely in a straight line in a first direction R1. In respect of the axis of rotation of the motor of the electric motor 2 the direction R1 can also be referred to as the axial direction. The cables 5b and 5c are routed entirely identically through the first openings 7b and 7c into the terminal box 1. The cables 5a, 5b and 5c thus run in parallel to one another. They are all fixed in the first openings 7a, 7b and 7c by screw cable clamps not shown in the figure. The first openings 7a, 7b and 7c are holes drilled in the housing wall side 6a.

Cables 5a, 5b and 5c possess cable shoes 15a, 15b and 15c at their ends, which have a central hole that allows the cables 5a, 5b and 5c to be attached to associated contact elements 4a, 4b and 4c. The contact elements 4a, 4b and 4c are embedded in a base element 12 embodied from an isolating material. They are only accessible from one side, which lies in the plane spanned by the direction R1 and a direction R2 at right angles R2 to said direction. The normals of these contact element side are formed by the direction R3. The directions R1, R2 and R3 are thus all at right angles to one another. The contact elements 4a, 4b and 4c have a hole, so that together with the holes in the cable shoes 15a, 15b and 15c, the cables 5a, 5b and 5c are able to be attached to the contact elements 4a, 4b and 4c by screws not shown in the figure. The cables 5a, 5b and 5c meet the contact elements 4a, 4b and 4c directly and are able to be directly electrically connected to said elements.

Embodied between the respective adjacent contact elements 4a and 4b or 4b and 4c is an isolating bar 13ab or 13bc respectively. Among other things these can prevent a metal part 12 applied in direction R3 to the base element 12 being able to cause an undesired short-circuit between the adjacent contact elements 4a, 4b and 4c. In addition they form a support for a cover of the terminal box 1 not shown in FIG. 1, which closes off the box from above and extends at right angles to the direction R3.

Figure 2:
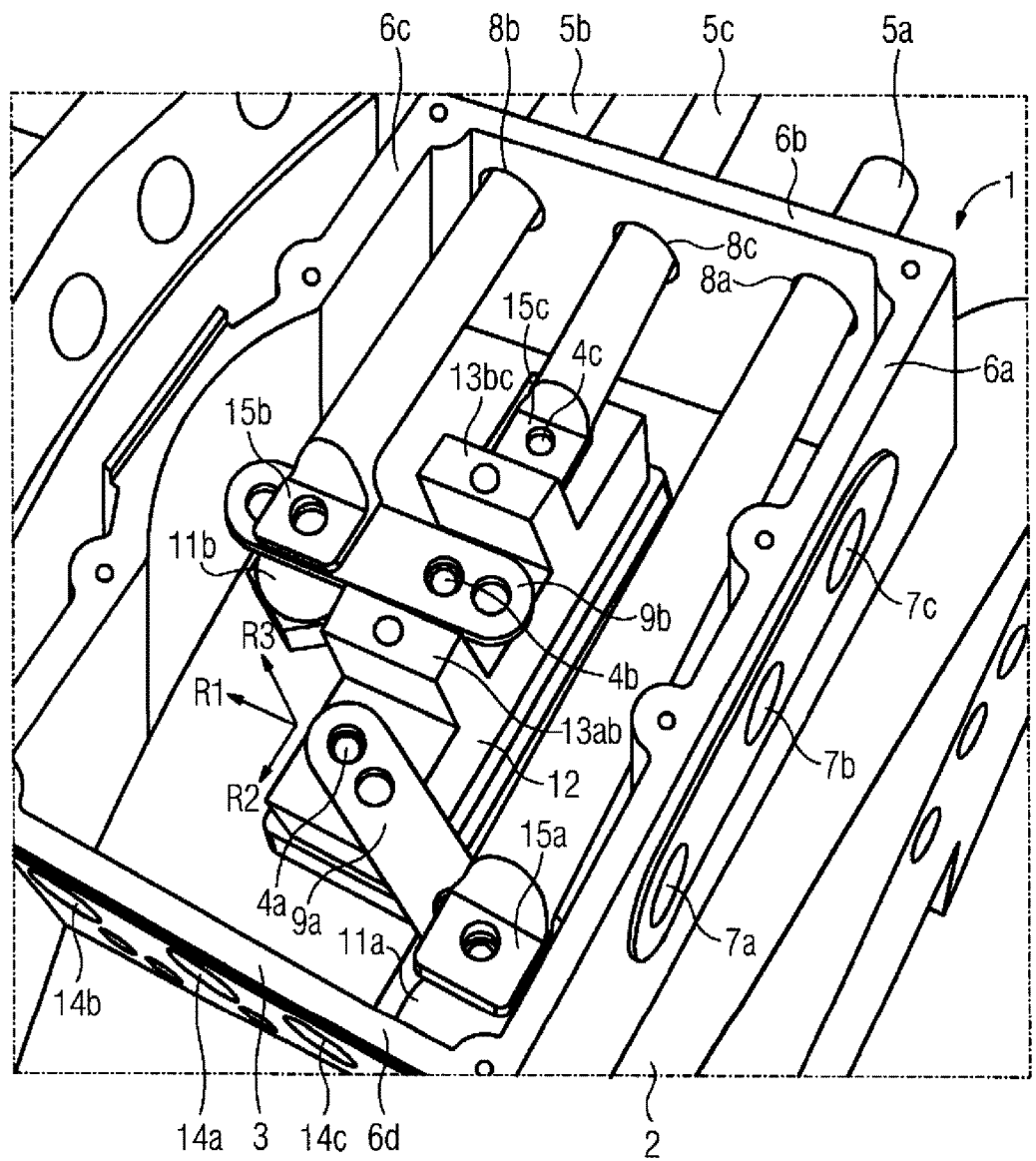
FIG. 2 shows a terminal box into which cables are routed in a second direction.

Three further second openings 8a, 8b and 8c are embodied in terminal box 1 in a second housing wall side 6b. This makes further access into the interior of the housing 3 possible. This allows a second connection option for the cables 5a, 5b and 5c, and is shown in FIG. 2. The cables 5c are routed in such cases through the second opening 8c in direction R2 into the terminal box 1 and run onwards within the terminal box 1 in a straight line in direction R2. The cable shoe 15c of the cable 5c meets the contact element 4c directly and is able to be directly electrically connected to the latter. However this does not apply to cables 5a and 5b, which are routed in parallel to cable 5c through the second openings 8a and 8b into the housing 3. They also run within the housing 3 and in a straight line in direction R2 and can therefore no longer meet the contact elements 4a and 4b directly. Therefore an electrical bridge solution is provided.

As can be seen from an FIG. 1, the terminal box 1 is suitably embodied to make the second connection option depicted in FIG. 2 possible in a simple and uncomplicated manner. There are namely isolating support receiving threads 10a and 10b provided, which predetermine suitable required positions for isolating supports 11a and 11b. The cable 5a can therefore be electrically connected to the contact element 4a in the following manner: the isolating support 11a is placed on the isolating support receiving thread 10a and is fixed with the aid of a screw. Then a conductor bar 9a which has inner and outer drilled holes for screws is placed onto the isolating support 11a and the contact element 4a, so that in each case the outer screw hole comes to rest above the screw holes provided in the contact element 4a and in the isolating support 11a. Then the conductor bar 9a is connected via the screw holes with the contact element 4a on one side and if necessary with the isolating support 11a on the other side. The cable 5a routed through the second opening 8a into the interior of the terminal box 1 can be attached via the cable shoe 15a to the conductor bar 9a. Electrical contact is established via the conductor bar 9a between the contact elements 4a and the cable 5a.

Just as the isolating support receiving thread 10a is assigned to the contact element 4a, the isolating support receiving thread 10b is assigned to the contact element 4b. An electrical connection between the cable 5b and the contact element 4b is now made in an entirely similar manner to that made between the cable 5a and the contact element 4a. In the exemplary embodiment however the inner screw holes of the conductor bar 9b are used in each case.

The cables 5a, 5b and 5c are also fixed in their turn via screw cable clamps not shown in the figure in the holes 8a, 8b and 8c. In respect of the axis of rotation of the electric motor 2 the direction R2 can also be referred to as a tangential direction.

In the exemplary embodiment third openings 14a, 14b and 14c are also embodied in the housing wall side 6d, which make access for the cables 5a, 5b and 5c into the terminal box 1 possible in direction −R2. If this connection option is selected and the connection option realized in FIG. 2 is taken as the starting point, only the insulating support 11a must be placed in the insulating support receiving thread 10c and the conductor bar 9a now connected to the contact element 4c. To achieve a similar electrical contacting, the cable 5c is routed in direction −R2 through the third opening 14c into the terminal box 1 and electrically connected by the offset conductor bar 9a to the contact element 4c. The electrical contacting of the cable 5b with the contact element 4b remains in existence but now however with a cable 5b routed through the third opening 14b. With the third connection option the cable 5a is routed through the third opening 14a and directly meets contact element 4a, without the need for a conductor bar.

Figure 3:
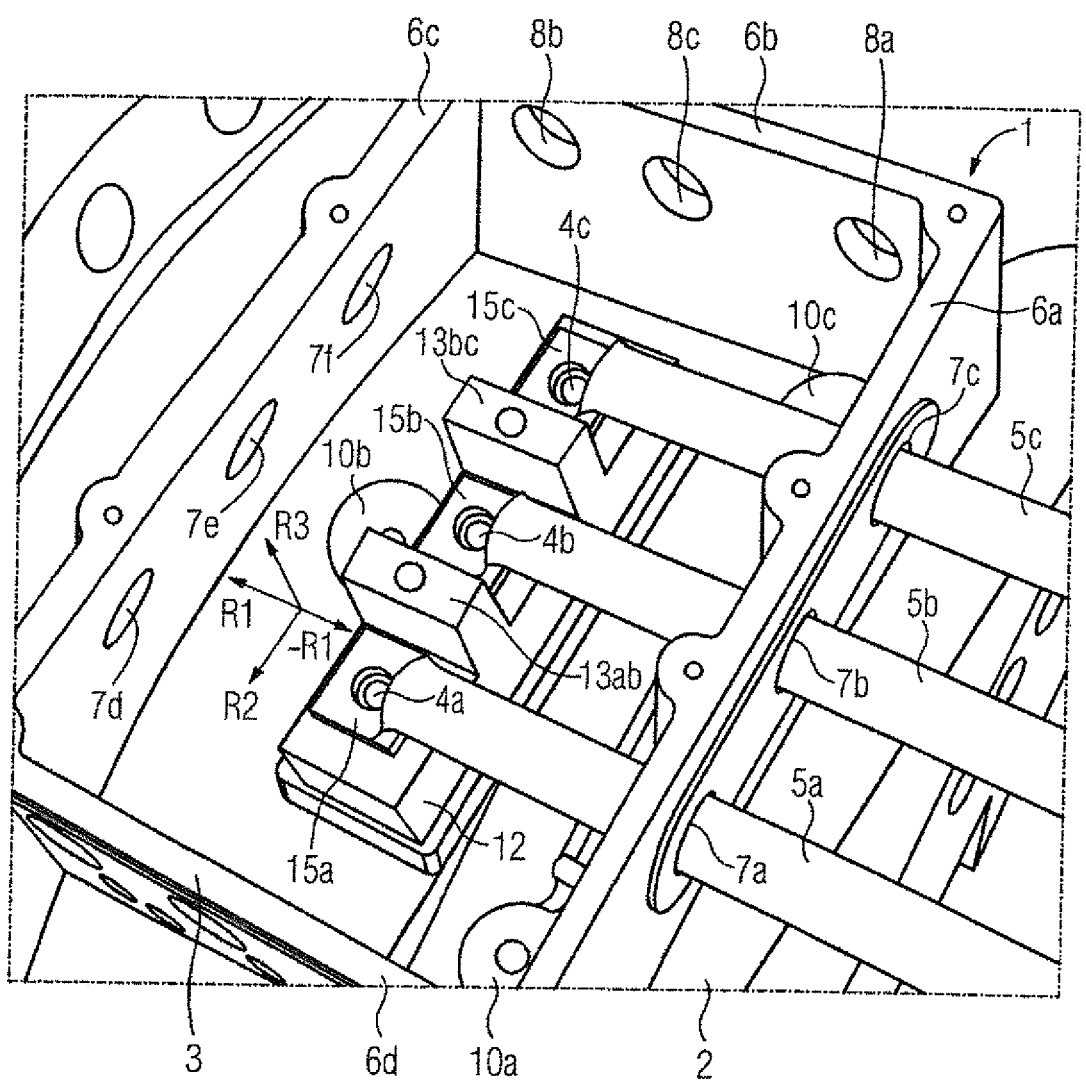
FIG. 3 shows a terminal box into which cables can be routed in a fourth direction.

In the exemplary embodiment there is a mounting flange on the housing wall side 6c of the terminal box 1. Therefore no openings are provided here in the housing wall side 6c. For an alternative embodiment without mounting flange, the cables 5a, 5b and 5c could however also be routed in a fourth direction −R1, as shown in FIG. 3 through fourth openings, which are embodied in the housing wall side 6c. This would produce a connection option equivalent to FIG. 1.

The cable exit openings not used in each case can be closed off by filler plugs and the entire terminal box 1 can be covered by a cover not shown in the figure. For example, for the connection option depicted in FIG. 1 the second openings 8a, 8b and 8c and also the third openings 14a, 14b and 14c can be closed off by filer plugs.

The invention allows the power connection of heavy-current devices even in restricted spaces. A standardized terminal box 1 with many different connection options is created. Instead of individual customer solutions all two, three or four connection types can be realized with one molded part, one processing operation and one order number. The customer can decide for themselves which connection option is best suited to them and can if necessary decide on a connection option only after delivery of the electric motor 2 with terminal box 1. They can if necessary also try out a number of variants. To do this only a maximum of two components (conductor bar 9a, 9b and isolating support 11a, 11b) ever have to be moved. For different applications or customers identical products can be offered and sold. Quantity degression and reduced energy outlay mean the cost savings and improved market opportunities are also produced.

In the exemplary embodiment the housing wall sides 6a, 6b, 6c and 6d are at right angles to one another and are embodied in one piece as molded parts. Many different alternative designs are conceivable here. For example the housing wall sides 6a, 6b, 6c and 6d can also be arranged in an overhead view from direction −R3 in a trapezoidal shape relative to one another. A rounded, essentially oval embodiment is also conceivable. In particular the housing 3 does not have to be embodied in one piece. For example the first openings 7a, 7b and 7c can be embodied in an adapter plate, which is placed on and fixed into an elongated opening in direction R2 and in the housing wall side 6a. The adapter plate is then to be seen as a component of the housing 3, which is then embodied in several parts. The adapter plate is then part of a housing wall.

The invention claimed is:

1. A connecting device including electric cables connected to an electric machine of a vehicle, said connecting device comprising:
   at least two contact elements;
   a housing having a first housing wall provided with at least two first openings for allowing passage of the cables in a first direction and in a straight line within the housing to meet the contact elements for electrical connection therewith in one-to-one correspondence, and a second housing wall provided with at least two second openings for allowing passage of the cables in a second direction oriented in a straight line within the housing;
   wherein only one of the cables directly meets one of the contact elements for electrical connection therewith, while a conductor bar electrically connects the other one of the cables to the other one of the contact elements; and
   an isolating support provided in the housing,
   said conductor bar being placed on the isolating support and on the other one of the contact elements and one side of the conductor bar connected with the other one of the contact elements, and the other one of the cables being attached to the conductor bar to establish electrical contact via the conductor bar,
   wherein the electric cables are connected to the electric machine of the vehicle.

2. The connecting device of claim 1, further comprising a receiving element, said isolating support being positioned at a spatial arrangement which is predetermined by the receiving element, said isolating support being fastenable to the receiving element.

3. The connecting device of claim 1, further comprising a base element, said at least two contact elements being embedded in the base element such that each of the contact elements is electrically contacted exclusively from one side, which lies in a plane spanned by the first and second directions.

4. The connecting device of claim 3, further comprising at least one isolating bar formed on the base element and extending between the at least two contact elements so as to prevent a simultaneous electrical contacting of the contact elements by one of the cables running in a straight line in the second direction.

5. The connecting device of claim 1, wherein the housing has a third housing wall provided with at least two third openings for allowing passage of the cables in a third direction and in a straight line within the housing such that the cables directly meet the contact elements for electrical connection therewith in one-to-one correspondence, said third direction oriented essentially antiparallel to the second direction.

6. The connecting device of claim 1, wherein the housing has a fourth housing wall provided with at least two fourth openings for allowing passage of the cables in a fourth direction and in a straight line within the housing to meet the contact elements in one-to-one correspondence, said fourth direction oriented essentially antiparallel to the first direction.

7. A kit, comprising a connecting device including electric cables connected to an electric machine of a vehicle, said connecting device including
at least two contact elements,
a housing having a first housing wall provided with at least two first openings for allowing passage of the cables in a first direction and in a straight line within the housing to meet the contact elements for electrical connection therewith in one-to-one correspondence, and a second housing wall provided with at least two second openings for allowing passage of the cables in a second direction oriented in a straight line within the housing, wherein only one of the cables directly meets one of the contact elements for electrical connection therewith, while a conductor bar electrically connects the other one of the cables to the other one of the contact elements,
an isolating support provided in the housing, with the conductor bar being placed on the isolating support and on the other one of the contact elements and one side of the conductor bar connected with the other one of the contact elements, and the other one of the cables being attached to the conductor bar to establish electrical contact via the conductor bar,
a receiving element, said isolating support being positioned at a spatial arrangement which is predetermined by the receiving element, said isolating support being fastenable to the receiving element.

8. The kit of claim 7, wherein the isolating support is made of electrically isolating material.

9. The kit of claim 7, wherein the at least two contact elements are arranged along a straight line which runs in the second direction.

10. The kit of claim 7, wherein the connecting device has a base element, said at least two contact elements being embedded in the base element such that each of the contact elements is electrically contacted exclusively from one side, which lies in a plane spanned by the first and second directions.

11. The kit of claim 10, wherein the connecting device has at least one isolating bar formed on the base element and extending between the at least two contact elements so as to prevent a simultaneous electrical contacting of the contact elements by one of the cables running in a straight line in the second direction.

12. The kit of claim 7, wherein the housing has a third housing wall provided with at least two third openings for allowing passage of the cables in a third direction and in a straight line within the housing such that the cables directly meet the contact elements for electrical connection therewith in one-to-one correspondence, said third direction oriented essentially antiparallel to the second direction.

13. The kit of claim 7, wherein the housing has a fourth housing wall provided with at least two fourth openings for allowing passage of the cables in a fourth direction and in a straight line within the housing to meet the contact elements in one-to-one correspondence, said fourth direction oriented essentially antiparallel to the first direction.

14. An electric machine, especially an electric motor of a vehicle, comprising a connecting device including electric cables connected to the electric machine of the vehicle, said connecting device including at least two contact elements, a housing having a first housing wall provided with at least two first openings for allowing passage of the cables in a first direction and in a straight line within the housing to meet the contact elements for electrical connection therewith in one-to-one correspondence, and a second housing wall provided with at least two second openings for allowing passage of the cables in a second direction oriented in a straight line within the housing,
wherein only one of the cables directly meets one of the contact elements for electrical connection therewith, while a conductor bar electrically connects the other one of the cables to the other one of the contact elements,
wherein an isolating support is provided in the housing, the conductor bar is placed on the isolating support and on the other one of the contact elements and one side of the conductor bar connected with the contact element, and the other one of the cables is attached to the conductor bar to establish electrical contact via the conductor bar.

15. The electric machine of claim 14, wherein the connecting device has a receiving element which is assigned to one of the contact elements, wherein the isolating support is positioned at a spatial arrangement which is predetermined by the receiving element, said isolating support being fastenable to the receiving element.

16. The electric machine of claim 14, wherein the at least two contact elements are arranged along a straight line which runs in the second direction.

17. The electric machine of claim 14, wherein the connecting device has a base element, said at least two contact elements being embedded in the base element such that each of the contact elements is electrically contacted exclusively from one side, which lies in a plane spanned by the first and second directions.

18. The electric machine of claim 17, wherein the connecting device has at least one isolating bar formed on the base element and extending between the at least two contact elements so as to prevent a simultaneous electrical contacting of the contact elements by one of the cables running in a straight line in the second direction.

19. The electric machine of claim 14, wherein the housing has a third housing wall provided with at least two third openings for allowing passage of the cables in a third direction and in a straight line within the housing such that the cables directly meet the contact elements for electrical connection therewith in one-to-one correspondence, said third direction oriented essentially antiparallel to the second direction.

20. The electric machine of claim 14, wherein the housing has a fourth housing wall provided with at least two fourth openings for allowing passage of the cables in a fourth direction and in a straight line within the housing to meet the contact elements in one-to-one correspondence, said fourth direction oriented essentially antiparallel to the first direction.

21. A vehicle, especially a commercial vehicle, comprising:
    an electrical machine constructed in the form of a wheel hub motor; and
    a connecting device including electric cables connected to the electric machine of the vehicle, said connecting device including at least two contact elements, a housing having a first housing wall provided with at least two first openings for allowing passage of the cables in a first direction and in a straight line within the housing to meet the contact elements for electrical connection therewith in one-to-one correspondence, and a second housing wall provided with at least two second openings for allowing passage of the cables in a second direction oriented in a straight line within the housing, wherein only one of the cables directly meets one of the contact elements for electrical connection therewith, while a conductor bar electrically connects the other one of the cables to the other one of the contact elements, wherein an isolating support is provided in the housing, the conductor bar is placed on the isolating support and on the other contact element and one side of the conductor bar connected with the other one of contact elements, and the other one of the cables is attached to the conductor bar to establish electrical contact via the conductor bar.

22. A method for connecting electric cables to a connecting device of an electric machine of a vehicle, comprising:
    passing a first one of the cables connected to the electric machine of the vehicle through an opening in one housing wall of a housing in a first direction in a straight line within the housing for electrical connection therewith in one-to-one correspondence, passing a second one of the cables through an opening in another housing wall of the housing in a second direction oriented in a straight line within the housing;
    directly electrically connecting the first one of the cables with a contact element;
    electrically connecting the second one of the cables with another contact element via a conductor bar,
    providing an isolating support in the housing,
    placing the conductor bar on the isolating support and on the another contact element and connecting one side of the conductor bar with the another contact element, and
    attaching the second one of the cables to the conductor bar to establish electrical contact via the conductor bar.

* * * * *